(12) United States Patent
Nagata et al.

(10) Patent No.: US 7,313,509 B2
(45) Date of Patent: Dec. 25, 2007

(54) SIMULATION METHOD AND APPARATUS, AND COMPUTER-READABLE STORAGE MEDIUM

(75) Inventors: Megumi Nagata, Kawasaki (JP); Masaki Tosaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 589 days.

(21) Appl. No.: 10/345,338

(22) Filed: Jan. 16, 2003

(65) Prior Publication Data

US 2003/0233193 A1 Dec. 18, 2003

(30) Foreign Application Priority Data

Jun. 17, 2002 (JP) ............. 2002-176016

(51) Int. Cl.
*G06F 7/62* (2006.01)
(52) U.S. Cl. ............................. 703/14; 716/4
(58) Field of Classification Search ............... 703/14
See application file for complete search history.

(56) References Cited

U.S. PATENT DOCUMENTS

| | | | |
|---|---|---|---|
| 6,868,534 B2* | 3/2005 | Fattouh et al. ........... | 716/6 |
| 2002/0077798 A1* | 6/2002 | Inoue et al. ............. | 703/19 |
| 2003/0083856 A1* | 5/2003 | Yoshimura et al. ........ | 703/18 |

FOREIGN PATENT DOCUMENTS

JP 2001-230323 8/2001

OTHER PUBLICATIONS

"Electrical Parameter Analysis from Three-Dimensional Interconnection Geometry, by Kamikawai et al., (IEEE 1985)".*
"Performance Analysis of MCM System, by Truzzi et al. (IEEE 1997)".*
Exact Closed Form Formula for Partial Mutual Inductances of On-Chip Interconnects, by Zhong et al. (IEEE 2002).*
Rivetta et al. teaches a Noise Immunity Analysis of the Forward Hadron Calorimeter, Sep. 2002.*
Weeks, W.T., et al., "Resistive and Inductive Skin Effect in Rectangular Conductors", IBM J. Res. Develop., vol. 23, No. 6, pp. 652-660, Nov. 1979.

* cited by examiner

*Primary Examiner*—Paul Rodriguez
*Assistant Examiner*—Andre Pierre-Louis
(74) *Attorney, Agent, or Firm*—Staas & Halsey LLP

(57) ABSTRACT

A simulation method makes a noise analysis based on parameters including a conductor resistance which takes skin effect into consideration. The simulation method calculates a first resistance of one of conductors having a largest cross sectional area, obtains a predetermined pitch which saturates a diagonal component of a second resistance of a conductor with reference to the first resistance and makes the diagonal component approximately constant, by varying a pitch of the conductors, calculates the parameters for each pitch with respect to one of the pitches larger than or equal to the predetermined pitch and the pitches smaller than the predetermined pitch, and substitutes the parameters calculated for the one of the pitches with respect to the other of the pitches, and outputs calculation results.

14 Claims, 11 Drawing Sheets

SIMULATION METHOD AND APPARATUS, AND COMPUTER-READABLE STORAGE MEDIUM

BACKGROUND OF THE INVENTION

This application claims the benefit of a Japanese Patent Application No.2002-176016 filed Jun. 17, 2002, in the Japanese Patent Office, the disclosure of which is hereby incorporated by reference.

1. Field of the Invention

The present invention generally relates to simulation methods, simulation apparatuses and computer-readable storage media, and more particularly to a simulation method and a simulation apparatus which are suited for making a noise analysis by simulation when designing electronic circuits such as large scale integrated circuits (LSIs), multi chip modules (MCMs) and printed circuit boards (PCBs), and to a computer-readable storage medium which stores a program for causing a computer to carry out such a simulation.

Recently, due to reduce size and increased operation speed of various electronic circuits, it has become important to make a noise analysis and to take noise countermeasures when designing an electronic circuit. The noise countermeasures refer to various measures which are taken in order to suppress noise generated in the electronic circuit, based on results of the noise analysis.

2. Description of the Related Art

Conventionally, various noise analyzing tools have been proposed to make the noise analysis when designing the electronic circuit. The noise analyzing tool makes the noise analysis and a noise check using a circuit simulator after making the assemble design of the electronic circuit, so as to determine the noise countermeasures for suppressing the noise. The design of the electronic circuit is modified based on the determined noise countermeasures if necessary. After the design modification, a noise analysis and a noise check are made again, and the above described procedure is repeated until the noise falls within a tolerable range.

The noise to be mainly considered when designing the electronic circuit includes reflection noise and crosstalk noise. Normally, the reflection noise is generated due to a mismatch between characteristic impedances of an internal resistance of a driver and a transmission line. On the other hand, the crosstalk noise greatly depends on a driving capability of the driver and a gap (pitch) of an adjacent wiring pattern.

When making the noise analysis using a circuit simulator, the noise analysis is made based on various parameters, and the various parameters include a skin resistance coefficient which takes into consideration the skin effect. The skin effect refers to a phenomenon where the resistance increases towards a central portion of a conductor forming the wiring, and a current only flows in a vicinity of the conductor surface. The skin resistance coefficient refers to a resistance coefficient of the conductor which takes into consideration the skin effect. The effects of the skin effect no longer becomes negligible as the frequency of the signal passing through the conductor becomes high. Generally, the resistance of the conductor changes depending on the signal frequency, but if the skin resistance coefficient is known, the resistance of the conductor can be described as a function of the signal frequency, thereby making it possible to make a simulation with respect to an arbitrary signal frequency. For example, the resistance of the conductor and the skin resistance coefficient may be calculated based on an algorithm described in W. T. Weeks et al., "Resistive and Inductive Skin Effect in Rectangular Conductors", IBM J. RES. DEVELOP. Vol.23, No.6, pp.652-660, November 1979.

Conventionally, there exists a noise analyzing tool which divides the conductor into a plurality of parts when calculating the resistance of the conductor by taking into consideration the skin effect. However, in order to obtain the resistance of the conductor with a high accuracy, it becomes necessary to divide the conductor into a large number of small parts, and a calculation time is increased thereby. Particularly when making the noise analysis of a plurality of conductors such as adjacent wirings, the width of the ground becomes larger as the pitch of the conductors becomes larger, and it takes an extremely long time to make the calculations when the resistance of the conductor is calculated by dividing the conductor into a large number of small parts.

According to the conventional noise analyzing tool, the resistance of the conductor is calculated by taking into consideration the skin effect, regardless of a magnitude of the pitch of the conductors. For this reason, when calculating the resistance of the conductor by dividing the conductor into a large number of small parts, there were problems in that it takes an extremely long time to make the calculations, and that the noise analysis cannot be made at a high speed.

SUMMARY OF THE INVENTION

Accordingly, it is a general object of the present invention to provide a novel and useful simulation method, simulation apparatus and computer-readable storage medium, in which the problems described above are eliminated.

Another and more specific object of the present invention is to provide a simulation method, a simulation apparatus and a computer-readable storage medium which calculate a resistance of a conductor by taking into consideration the skin effect depending on a magnitude of a pitch of the conductors, so that a calculation time can be reduced and a noise analysis can be made at a high speed, even when employing a calculation method which obtains the resistance of the conductor by dividing the conductor into a large number of small parts.

Still another object of the present invention is to provide a simulation method for making a noise analysis based on parameters including a conductor resistance which takes skin effect into consideration, comprising the steps of (a) calculating a first resistance of a conductor having a largest cross sectional area of a plurality of conductors; (b) obtaining a predetermined pitch which saturates a diagonal component of a second resistance of a conductor with reference to the first resistance and makes the diagonal component approximately constant, by varying a pitch of the conductors; (c) calculating at least one of the parameters for each pitch with respect to one of the pitches larger than or equal to the predetermined pitch and the pitches smaller than the predetermined pitch, and substituting the at least one parameter calculated for the one of the pitches with respect to the other of the pitches larger than or equal to the predetermined pitch and the pitches smaller than the predetermined pitch; and (d) outputting calculation results of the step (c). According to the simulation method of the present invention, it is possible to calculate the resistance of the conductor by taking into consideration the skin effect depending on a magnitude of the pitch of the conductors, so that a calculation time can be reduced and the noise analysis can be made at a high speed, even when employing a calculation method which obtains the resistance of the conductor by dividing the conductor into a large number of small segments or parts.

A further object of the present invention is to provide a simulation apparatus for making a noise analysis based on parameters including a conductor resistance which takes skin effect into consideration, comprising first means for calculating a first resistance of a conductor having a largest cross sectional area of a plurality of conductors; second means for obtaining a predetermined pitch which saturates a diagonal component of a second resistance of a conductor with reference to the first resistance and makes the diagonal component approximately constant, by varying a pitch of the conductors; third means for calculating at least one of the parameters for each pitch with respect to one of the pitches larger than or equal to the predetermined pitch and the pitches smaller than the predetermined pitch, and substituting the at least one parameter calculated for the one of the pitches with respect to the other of the pitches larger than or equal to the predetermined pitch and the pitches smaller than the predetermined pitch; and fourth means for outputting calculation results of the third means. According to the simulation apparatus of the present invention, it is possible to calculate the resistance of the conductor by taking into consideration the skin effect depending on a magnitude of the pitch of the conductors, so that a calculation time can be reduced and the noise analysis can be made at a high speed, even when employing a calculation method which obtains the resistance of the conductor by dividing the conductor into a large number of small segments or parts.

Another object of the present invention is to provide a computer-readable storage medium which stores a program for causing a computer to make a noise analysis based on parameters including a conductor resistance which takes skin effect into consideration, where the program comprises a first procedure causing the computer to calculate a first resistance of a conductor having a largest cross sectional area of a plurality of conductors; a second procedure causing the computer to obtain a predetermined pitch which saturates a diagonal component of a second resistance of a conductor with reference to the first resistance and makes the diagonal component approximately constant, by varying a pitch of the conductors; a third procedure causing the computer to calculate at least one of the parameters for each pitch with respect to one of the pitches larger than or equal to the predetermined pitch and the pitches smaller than the predetermined pitch, and substitute the at least one parameter calculated for the one of the pitches with respect to the other of the pitches larger than or equal to the predetermined pitch and the pitches smaller than the predetermined pitch; and a fourth procedure causing the computer to output calculation results of the third procedure. According to the computer-readable storage medium of the present invention, it is possible to calculate the resistance of the conductor by taking into consideration the skin effect depending on a magnitude of the pitch of the conductors, so that a calculation time can be reduced and the noise analysis can be made at a high speed, even when employing a calculation method which obtains the resistance of the conductor by dividing the conductor into a large number of small segments or parts.

Other objects and further features of the present invention will be apparent from the following detailed description when read in conjunction with the accompanying drawings.

DESCRIPTION OF THE PREFERRED EMBODIMENTS

Figure 1:
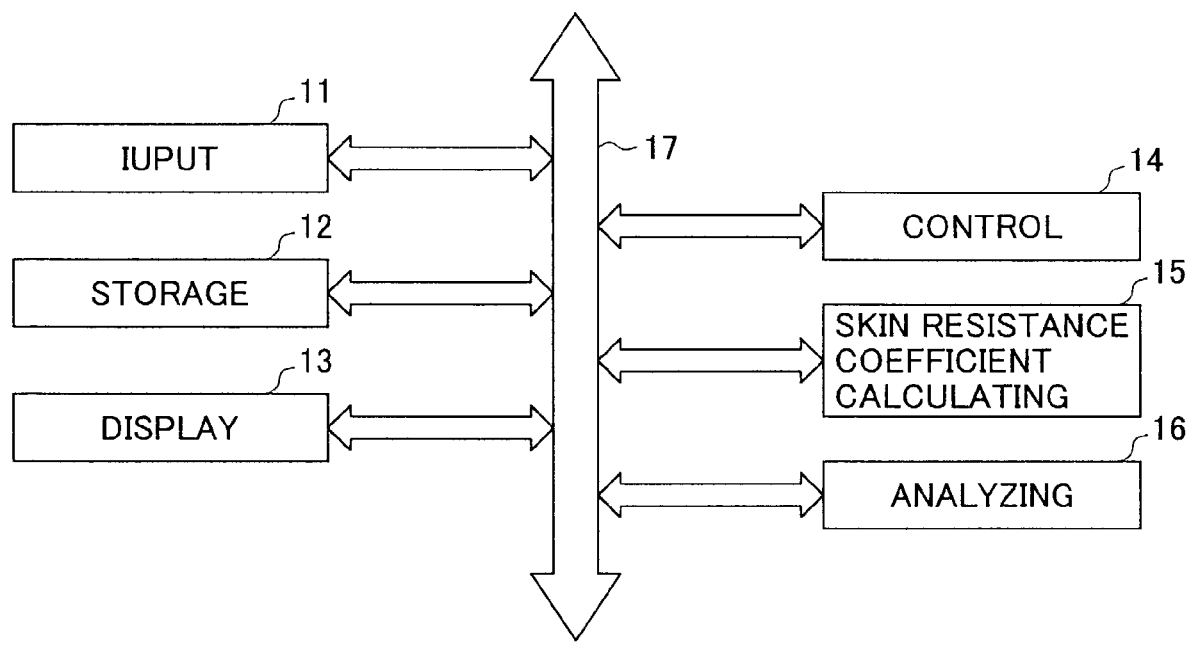
FIG. 1 is a system block diagram showing an important part of a first embodiment of a simulation apparatus according to the present invention.

A description will be given of various embodiments of a simulation method, a simulation apparatus and a computer-readable storage medium according to the present invention, by referring to the drawings.

FIG. 1 is a system block diagram showing an important part of a first embodiment of the simulation apparatus according to the present invention. This first embodiment of the simulation apparatus employs a first embodiment of the simulation method according to the present invention and a first embodiment of the computer-readable storage medium according to the present invention. The simulation apparatus shown in FIG. 1 includes an input section 11, a storage section 12, a display section 13, a control section 14, a skin resistance coefficient calculating section 15, and an analyzing section 16 which are connected via a bus 17 through which data are transferred. The control section 14, the skin resistance coefficient calculating section 15 and the analyzing section 16 correspond to a computer program for carrying out the first embodiment of the simulation method.

Parameters which are required for the simulation are input from the input section 11 and stored in the storage section 12. The skin resistance coefficient calculating section 15 calculates a resistance and a skin resistance coefficient of a conductor depending on an analyzing frequency, using the parameters stored in the storage section 12. The analyzing section 16 carries out a simulation by taking into consideration the skin effect, using the value of the skin resistance coefficient calculated by the skin resistance coefficient calculating section 15. Calculation results of the skin resistance coefficient calculating section 15 and simulation results of the analyzing section 16 are displayed on the display section 13. The control section 14 controls the general operation of the entire simulation apparatus.

As described above, in general, the resistance of the conductor changes depending on the signal frequency. However, if the skin resistance coefficient is known, it is possible to describe the resistance of the conductor as a function of the signal frequency, thereby making it possible to easily carry out a simulation with respect to an arbitrary signal frequency.

Figure 2:
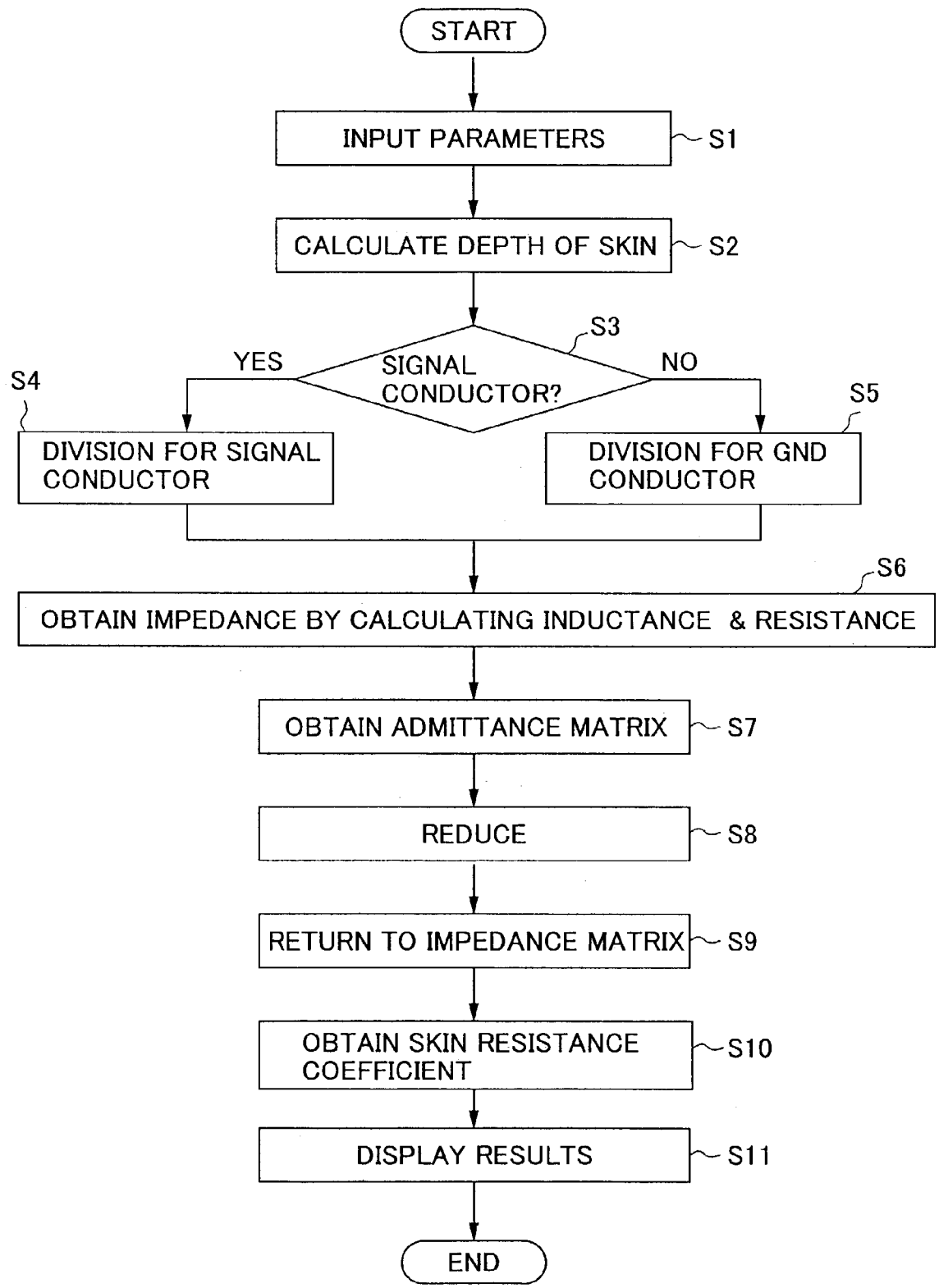
FIG. 2 is a flow chart for explaining a calculation process by a skin resistance coefficient calculating section of the first embodiment.

FIG. 2 is a flow chart for explaining a calculation process of the skin resistance coefficient calculating section 15 of the first embodiment. In this calculation process, the conductor which is an analyzing target is divided into a plurality of segments, each segment is further divided into a plurality of parts, and the resistance and the skin resistance coefficient of the conductor are calculated by numerical integration. The calculations are made based on the algorithm described in W. T. Weeks et al. referred above.

First, in a step S1, the user writes parameters based on a wiring design into an input file, and inputs the parameters to the simulation apparatus. In this case, the user checks the shape of the conductor which is the analyzing target, checks a pattern of transmission lines, checks the number of conductors, and inputs the parameters related to cross sectional shapes of the conductors. The conductor which is the analyzing target may be a signal conductor or a ground (GND) conductor.

Figure 3:
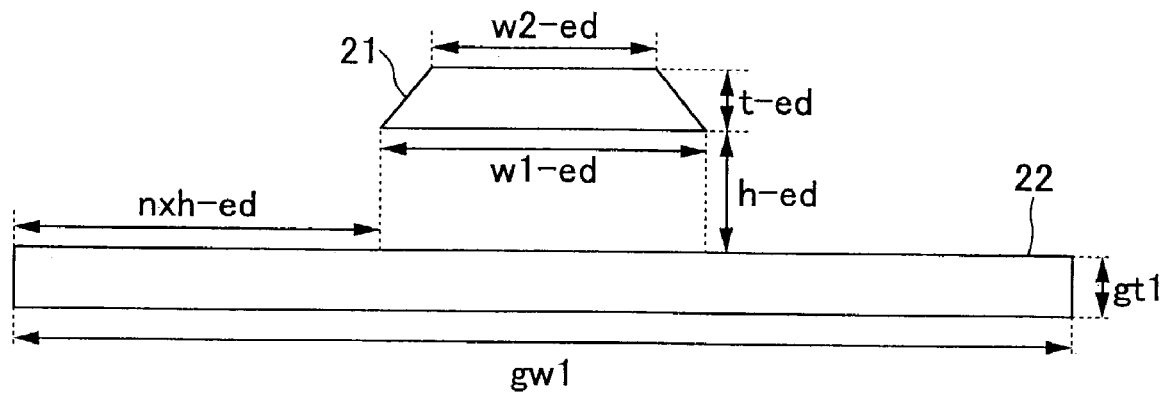
FIG. 3 is a diagram for explaining a first conductor model.
Figure 4:
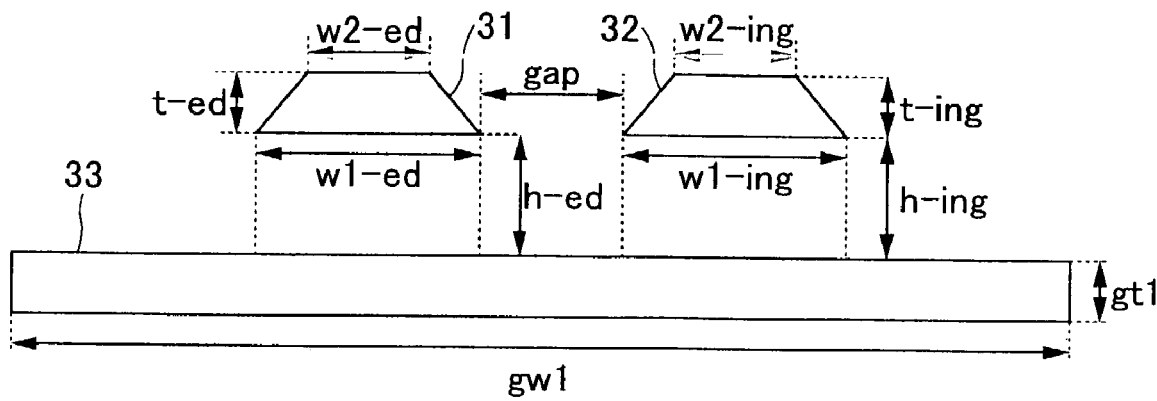
FIG. 4 is a diagram for explaining a second conductor model.

FIGS. 3, 4, 5 and 6 are diagrams respectively showing cross sectional shapes of first, second, third and fourth conductor models. FIG. 3 shows the cross sectional shape of a single-conductor micro-strip line made up of a signal conductor 21 and a ground (GND) conductor 22. FIG. 4 shows the cross sectional shape of a double-conductor micro-strip line made up of signal conductors 31 and 32 and a GND conductor 33.

Figure 5:
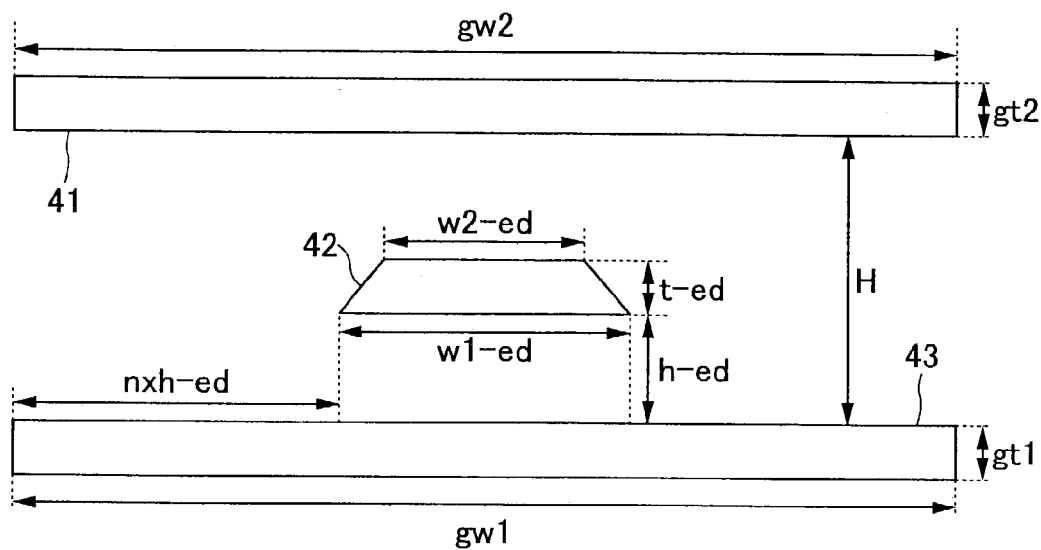
FIG. 5 is a diagram for explaining a third conductor model.
Figure 6:
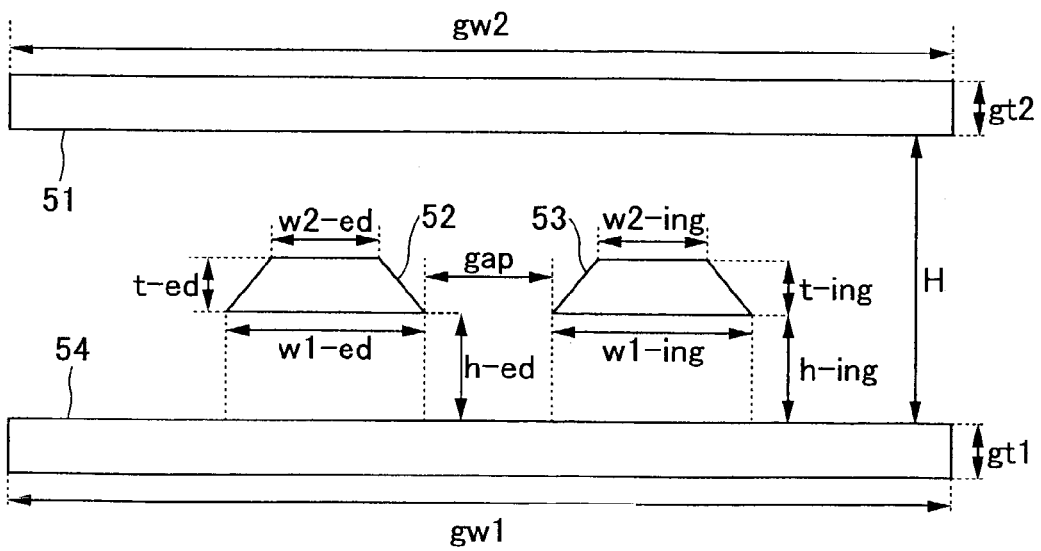
FIG. 6 is a diagram for explaining a fourth conductor model.

FIG. 5 shows the cross sectional shape of a single-conductor micro-strip line made up of a signal conductor 42 and GND conductors 41 and 43. FIG. 6 shows the cross sectional shape of a double-conductor micro-strip line made up of signal conductors 52 and 53 and GND conductors 51 and 54.

As may be seen from FIGS. 3 through 6, the cross sectional shape of the signal conductor may be treated as an arbitrary quadrilateral shape including rectangular and trapezoidal shapes. Parameters of the cross sectional shape include the following:

Parameters specifying a micro-strip line or a strip line
N: Number of signal conductors (N=1 in the case of the signal-conductor, and N=2 in the case of the double-conductor)
H: Height of insulator layer of the strip line
h-ed: Height of a bottom of a first signal conductor with reference to a surface of a first GND conductor
w1-ed: Width of the bottom of the first signal conductor
w2-ed: Width of a top of the first signal conductor
t-ed: Thickness of the first signal conductor
gw1: Width of the first GND conductor
gt1: Thickness of the first GND conductor
gw2: Width of a second GND conductor
gt2: Thickness of the second GND conductor
h-ing: Height of a bottom of a second signal conductor with reference to the surface of the first GND conductor
w1-ing: Width of the bottom of the second signal conductor
w2-ing: Width of a top of the second signal conductor
t-ing: Thickness of the second signal conductor
gap: Distance between the first signal conductor and the second signal conductor Of the above parameters, the width of the GND conductor may be specified using a GND magnification n as shown in FIGS. 3 and 5. In this case, the user inputs the GND magnification n in place of gw1, and gw1 is obtained from the following formula (1).

$$gw1 = h\text{-}ed \times n \times 2 + w1\text{-}ed \quad (1)$$

In addition, gw2 may also be specified using the GND magnification n, similarly to gw1.

Next, the user selects a common mode or a differential mode. The common mode is selected in a case where the voltage signs (current directions) of the two signal conductors are the same, and the differential mode is selected in a case where the voltage signs (current directions) of the two signal conductors are different. In addition, a signal frequency f and a conductivity σ of the conductor are input as analyzing conditions. For example, the unit of the signal frequency f is Hz, and the conductivity σ of copper at 20° C. is $5.0 \times 10^7$ 1/Ωm.

Furthermore, the user inputs conductor dividing conditions and numbers of vertical and horizontal divisions of the segments. Different numbers of divisions may be specified for a case where the integration is made with respect to the same segments and for a case where the integration is made with respect to different segments. For example, it is possible to efficiently carry out the integration calculation by dividing the segment into smaller divisions in the former case or by dividing the segment into larger divisions in the latter case, and it is also possible to suppress the problem of diverging integrated values.

Next, in a step S2 shown in FIG. 2, the skin resistance coefficient calculating section 15 calculates a depth δ of the skin based on the following formula (2), using a space permeability μ.

$$\delta = 1/(\pi f \mu \sigma)^{1/2} \quad (2)$$

A step S3 decides whether or not the conductor is a signal conductor, for each conductor. If the decision result in the step S3 is YES, a step S4 divides the signal conductor in the following manner. In other words, a predetermined number of division rates are determined in advance, and the cross section of the signal conductor is divided into lengths of "δ× (division rate)" based on the vertical and horizontal lengths of the cross section. The division rates are set so as to become smaller towards the surface of the signal conductor and larger in a direction away from the surface of the signal conductor. For example, in a case where five division rates 0.33, 0.84, 1.90, 4.00 and 7.00 are set, division planes are formed parallel to the conductor surface at depths which are δ×0.33, δ×0.84, δ×1.90, δ×4.00 and δ×7.00 from the conductor surface. Accordingly, the intervals of the division planes are smaller towards the conductor surface, and larger in the direction away from the conductor surface.

According to this method of division, the vertical and horizontal lengths (intervals of the division planes) of the segment change depending on the values of the depth δ of the skin and the division rate, and the number of segments changes depending on the number of division rates.

Of the segments which are generated by the above described division, each segment which does not satisfy predetermined conditions of an aspect ratio is further divided into smaller parts. For example, if the predetermined conditions require the aspect ratio of the segment to be 1:10 or 10:1 or less, each segment which does not satisfy the predetermined conditions is redivided so as to satisfy the predetermined conditions.

Figure 7:
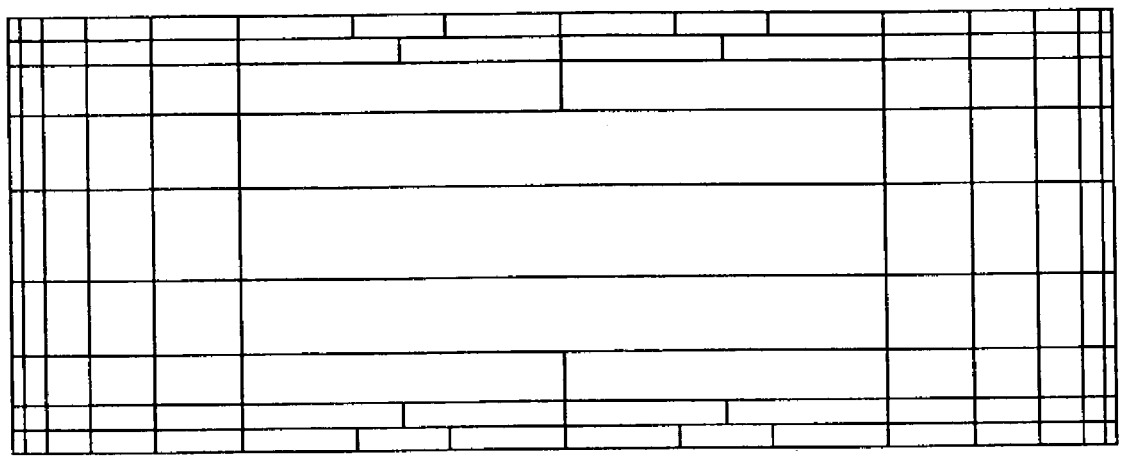
FIG. 7 is a diagram for explaining a method of dividing a signal conductor.

When the signal conductor having the rectangular cross section is divided according to the method of division described above, the plurality of segments shown in FIG. 7 are obtained. FIG. 7 is a diagram for explaining the method of dividing the signal conductor. The division planes are parallel to the conductor surface, and thus, each segment also has a rectangular cross section in this case. In addition, The signal conductor is divided into smaller segments towards the conductor surface, and thus, the sizes of the segments are smaller towards the conductor surface. On the other hand, the signal conductor is divided into larger segments in the direction away from the conductor surface, and hence, the sizes of the segments are larger in the direction away from the conductor surface.

By dividing the signal conductor in directions parallel to the conductor surface and into smaller segments towards the conductor surface, it becomes possible to calculate in more detail the parts where the current flows, and to simplify the calculation at parts where the current does not flow.

If the conductor is a GND conductor and the decision result in the step S3 shown in FIG. 2 is NO, a step S5 uses methods of division which are different in the vertical direction and in the horizontal direction. In the vertical direction, the GND conductor is divided into lengths of "δ×(division rate)" from the GND conductor surface confronting the signal conductor, similarly to the case of the signal conductor. In addition, in the horizontal direction, the GND conductor is divided into smaller segments towards the signal conductor and into larger segments in a direction away from the signal conductor. In general, the current tends to concentrate at parts of the GND conductor confronting the signal conductor, and for this reason, it is possible to simplify the calculation at parts where the current does not flow by dividing the GND conductor in the above described manner.

In the particular case, a normal is drawn to the GND conductor from an end of the signal conductor, and the length of the segment in the horizontal direction is determined depending on the distance from an intersecting point of the normal and the GND conductor surface. For example, the GND conductor is divided as follows when a distance (h-ed or h-ing) from the GND conductor surface to the signal conductor is denoted by h.

Figure 8:
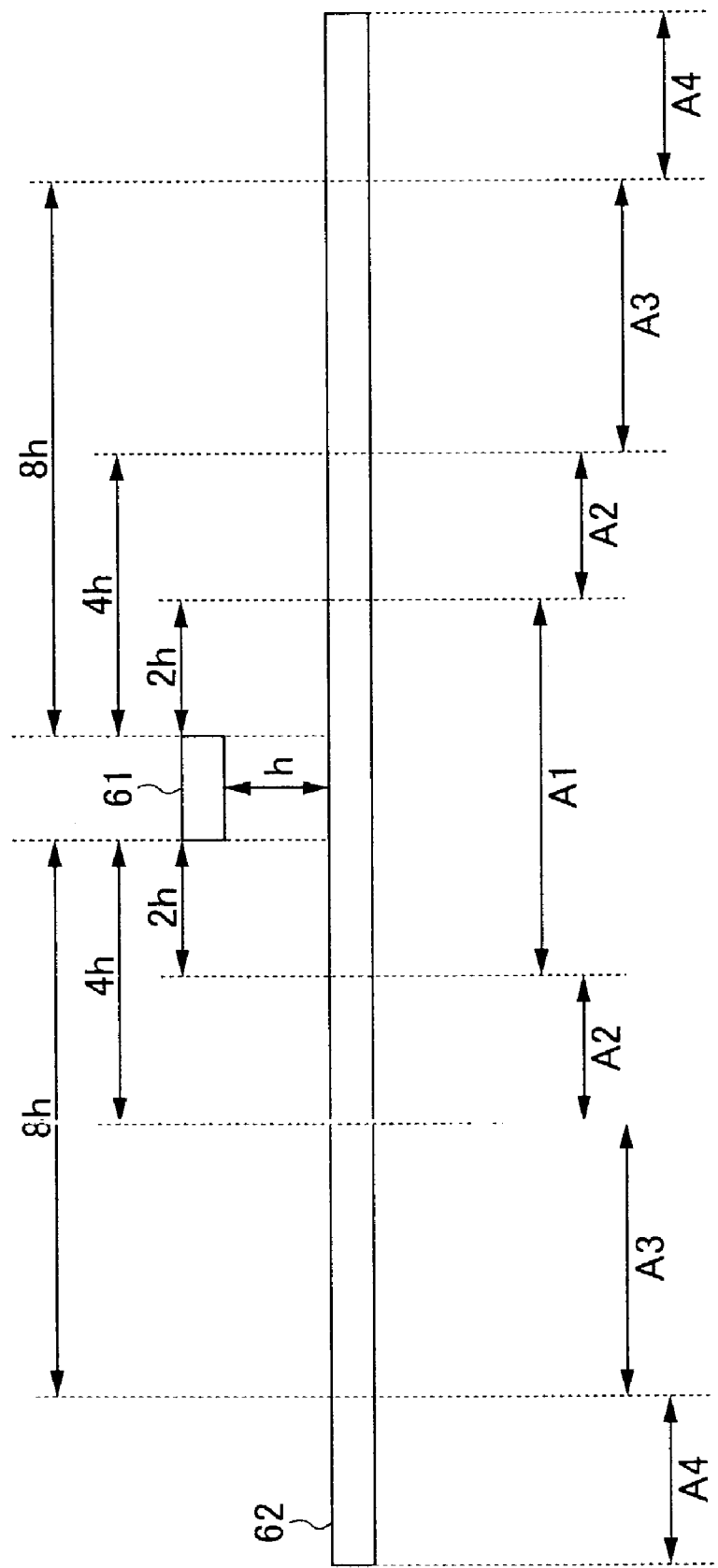
FIG. 8 is a diagram for explaining a first method of dividing a ground conductor.

Range from the end of the signal conductor up to 2h: Divide at widths of h/4
Range from 2 h to 4 h: Divide at widths of h/2
Range from 4 h to 8 h: Divide at widths of h
Range from 8 h and greater: Divide at widths of 2 h FIG. 8 is a diagram for explaining a first method of dividing the GND conductor of a single-conductor model. In this case, the GND conductor is divided by the above described method of dividing the GND conductor, by setting the distance between a signal conductor 61 and a GND conductor 62 to h. Hence, a region A1 is divided at widths of h/4, a region A2 is divided at widths of h/2, a region A3 is divided in widths of h, and a region A4 is vided in widths of h2.

Figure 9:
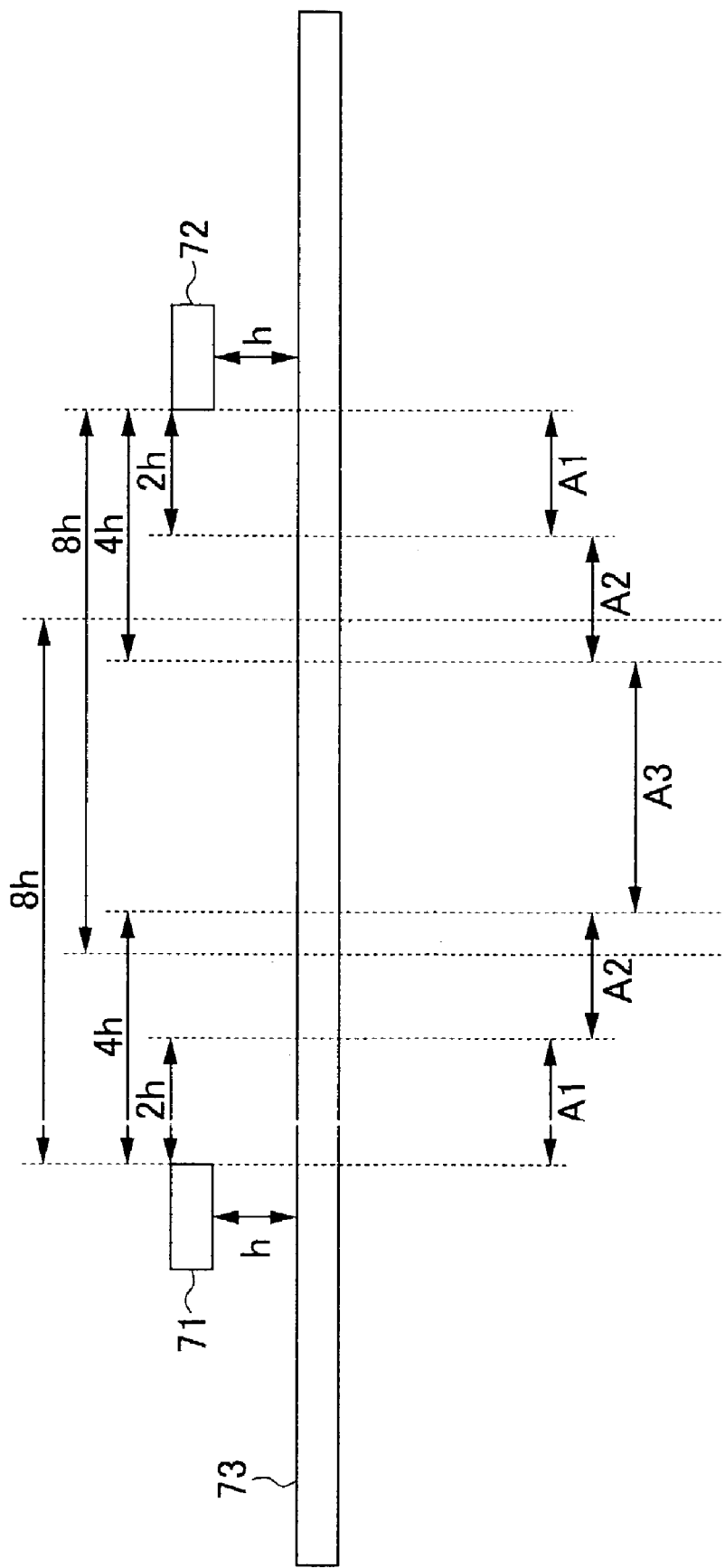
FIG. 9 is a diagram for explaining a second method of dividing the ground conductor.

FIG. 9 is a diagram for explaining a second method of dividing the GND conductor of a double-conductor model. In this case, the GND conductor is divided by the above described method of dividing the GND conductor, by setting the distances between signal conductors 71 and 72 and a GND conductor 32 to h. Hence, a region A1 is divided at widths of h/4, a region A2 is divided at widths of h/2 and a region A3 is divided in widths of h. In FIG. 9, the distances between the two signal conductors 71 and 72 and the GND conductor 73 are the same, but the shorter distance may be set to h if the distance between the signal conductor 71 and the GND conductor 73 is different from the distance between the signal conductor 72 and the GND conductor 73.

Furthermore, the following conditions are set with respect to the aspect ratios of the segments which are obtained by dividing the GND conductor, for example, depending on the distance h between the signal conductor and the GND conductor.

Range from the end of the signal conductor up to h: 1:10 or less
Range from h to 2h: 1:40 or less
Range from 2h to 4h: 1:80 or less Each segment which does not satisfy the above described conditions which are set with respect to the aspect ratio is further divided into smaller parts so as to satisfy the conditions.

Figure 10:
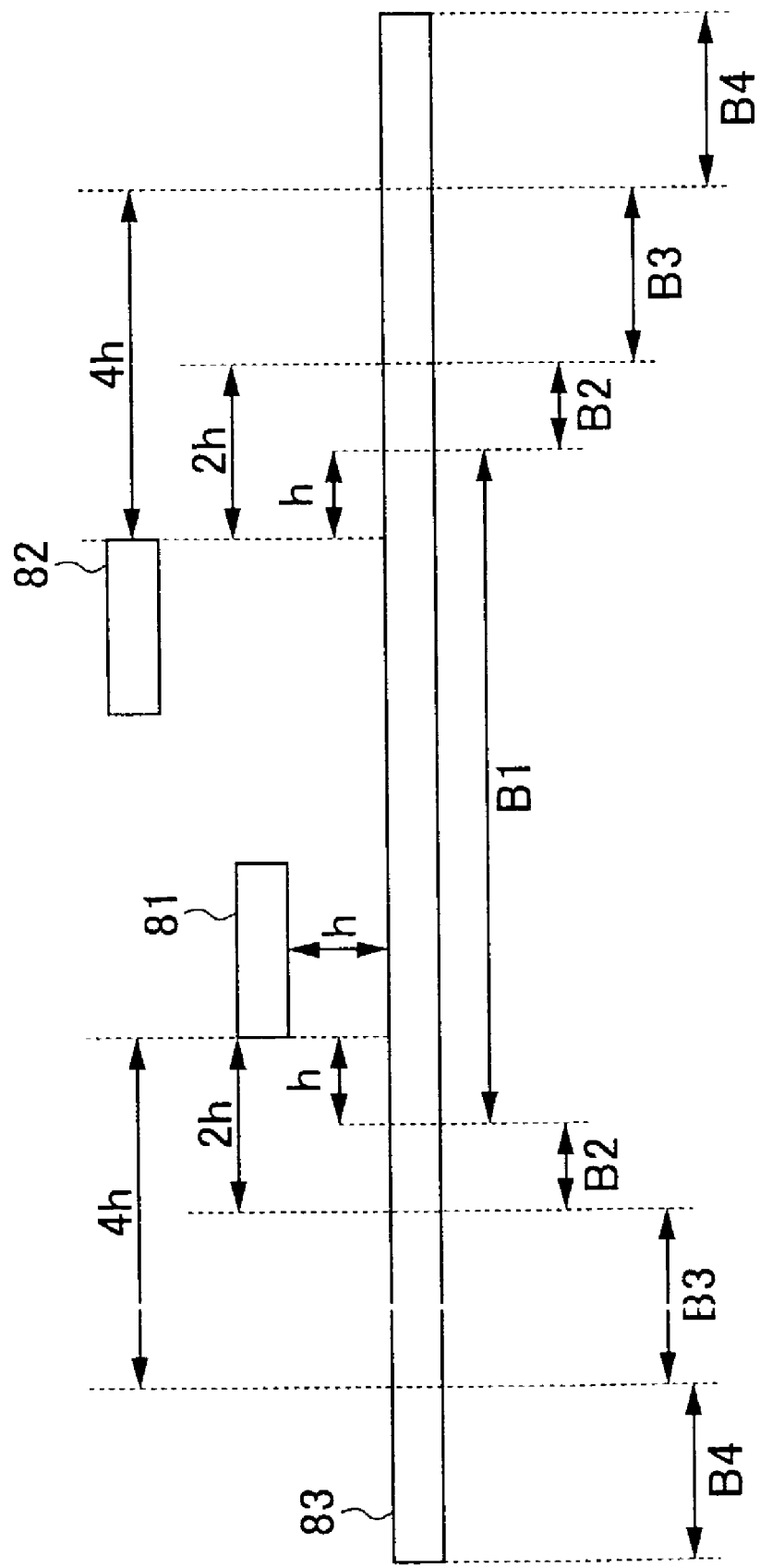
FIG. 10 is a diagram for explaining a third method of dividing the ground conductor.

FIG. 10 is a diagram for explaining a third method of dividing the GND conductor of the double-conductor model. In this case, a signal conductor 81 is closer to a GND conductor 83 than a signal conductor 82. Hence, the distance between the signal conductor 81 and the GND conductor 83 is set to h, and the aspect ratio is set as described above. Hence, a region B1 is redivided so that the aspect ratio falls within 1:10, a region B2 is redivided so that the aspect ratio falls within 1:40, and a region B3 is redivided so that the aspect ratio falls within 1:80. A region B4 is not redivided because no conditions are set therefor.

When the signal conductor and the GND conductor are divided into the segments in the above described manner, the skin resistance coefficient calculating section 15 divides each segment vertically and horizontally by a specified number of divisions, and calculates the inductance and resistance in a step S6 shown in FIG. 2 based on the following formulas (3) through (6).

$$L^{(P)}_{ij,km} = -(\mu/4\pi A_{ij}A_{km})\int\int\int\int \ln[(y-y')^2 + (z-z')^2]dy'dz'dydz \quad (3)$$

$$R_{ij,km} = r_{00} + r_{ij}\delta_{ik}\delta_{jm} \quad (4)$$

$$r_{ij} = 1/\sigma_i A_{ij}, \delta_{ji} = 1, \delta_{ij} = 0(i \neq j) \quad (5)$$

$$L_{ij,km} = L^{(P)}_{ij,km} - L^{(P)}_{ij,00} + L^{(P)}_{00,km} + L^{(P)}_{00,00} \quad (6)$$

In the above formulas (3) through (6), i and k denote the conductor numbers (i, k=0, 1, . . . N), and j and m denote segment numbers within each conductor (j=0, 1, . . . , $N_1$, m=0, 1, . . . , $N_k$). The 0th conductor corresponds to the GND conductor, and the 1st through Nth conductors correspond to the signal conductors. In addition, the 0th segment indicates a reference segment existing only in the GND conductor, and $N_i$ indicates the last segment number of the ith conductor. In the following description, a jth segment of the ith conductor is denoted by (i, j).

In the formula (3), the integration with respect to y and z indicates the integration with respect to the cross sectional area of the segment (i, j). The integration with respect to y' and z' indicates the integration of the cross sectional area of the segment (k, m).

$L^{(P)}_{ij,km}$ indicates the inductance between the segment (i, j) and the segment (k, m), and $A_{ij}$ indicates the cross sectional area of the segment (i, j). $r_{ij}$ indicates the D.C. resistance per unit length of the segment (i, j), and $\sigma_i$ indicates the conductivity of the ith conductor $R_{ij,km}$ and $L_{ij,km}$ respectively indicate the resistance and the inductance of each segment.

Next, an impedance $Z_{ij,km}$ is calculated from the following formula (7), using $J=(-1)^{1/2}$ and an angular frequency ω.

$$Z_{ij,km}=R_{ij,km}+J\omega L_{ij,km} \quad (7)$$

In the following, an impedance matrix having the impedance $Z_{ij,km}$ of the above formula (7) as an element is denoted by Z, and impedance matrixes for cases where f≠0 and f=0 are respectively denoted by $Z_{(f)}$ and $Z_{(DC)}$.

Next, a step S7 shown in FIG. 2 calculates admittance matrixes $Y_{(f)}$ and $Y_{(DC)}$ from the following formulas (8) and (9).

$$Y_{(f)}=Z_{(f)}^{-1} \quad (8)$$

$$Y_{(DC)}=Z_{(DC)}^{-1} \quad (9)$$

Then, a current value I(f) of each segment is calculated from the following formula (10), by setting a voltage V to V=1 (V).

$$I_{(f)}=Y_{(f)}V \quad (10)$$

Next, a step S8 shown in FIG. 2 reduces the admittance matrixes $Y_{(f)}$ and $Y_{(DC)}$ using the following formulas (11) through (13).

$$Y_{ik}=\sum_{j=1}^{Ni}\sum_{m=1}^{Nk}Y_{ij,km}(i,k=1,\ldots,N) \quad (11)$$

$$Y_{(f)} \to Y_{(f)} \quad (12)$$

$$Y_{(DC)} \to Y_{(DC)} \quad (13)$$

By making the above described reduction, $Y_{ij,km}$ is added with respect to all of the segments within each conductor, and the elements related to the GND conductor are dropped. Accordingly, $Y_{(f)}$ and $Y_{(DC)}$ become 1×1 matrixes in the case of the single-conductor, and become 2×2 matrixes in the case of the double-conductor.

Next, a step S9 shown in FIG. 2 returns the admittance matrixes into impedance matrixes based on the following formulas (14) and (15).

$$Z_{(f)}=Y_{(f)}^{-1} \quad (14)$$

$$Z_{(DC)}=Y_{(DC)}^{-1} \quad (15)$$

When the resistance and inductance of the signal conductor for a case where f≠0 are respectively denoted by $R_{(f)}$ and $L_{(f)}$ and the resistance and inductance of the signal conductor for a case where f=0 are respectively denoted by $R_{(DC)}$ and $L_{(DC)}$, the following formulas (16) and (17) stand.

$$Z_{(f)}=R_{(f)}+J\omega L_{(f)} \quad (16)$$

$$Z_{(DC)}=R_{(DC)}+J\omega L_{(DC)} \quad (17)$$

Accordingly, a step S10 shown in FIG. 2 obtains $R_{(f)}$, $R_{(DC)}$, $L_{(f)}$ and $L_{(DC)}$ from the formulas (16) and (17), and calculates a skin resistance coefficient Rs based on the following formula (18):

$$Rs=(R_{(f)}-R_{(DC)})/f^{1/2} \quad (18)$$

When the calculation of the skin resistance coefficient Rs ends, the simulation apparatus displays the calculation results on the display section 13 and outputs the calculation results to a log file, in a step S11 shown in FIG. 2. In this state, it is possible to make a setting so that the calculation results are added to the end of an existing log file. In addition, it is possible to select the necessary items from the following, for example, as an output setting for the calculation results.

Segment information
Resistance and inductance of each segment
Impedance matrix
Admittance matrix
Current value of each segment
Skin resistance coefficient When obtaining the skin resistance coefficient Rs for a plurality of frequencies such as 1 GHz and 2 GHz, for example, it is possible to carry out the calculations continuously by setting these frequencies in the input file in advance.

Figure 11:
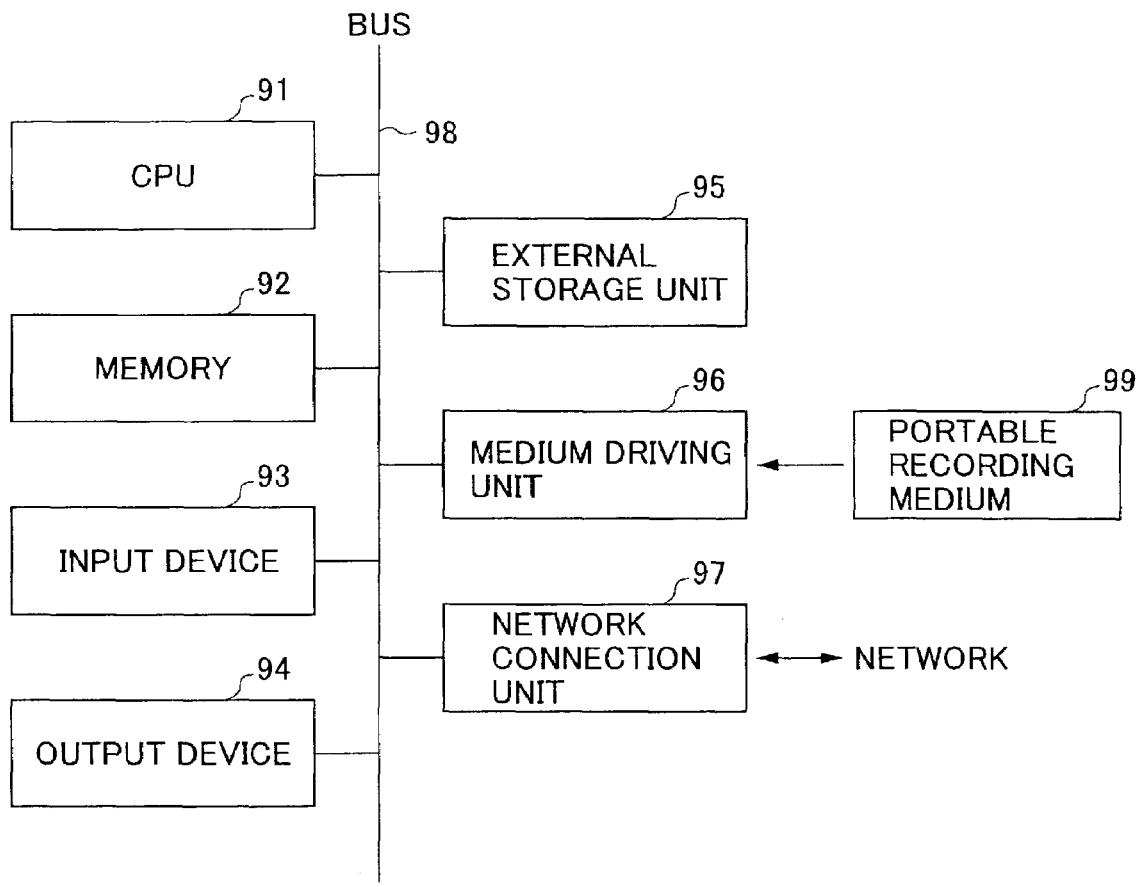
FIG. 11 is a system block diagram showing a structure of an information processing apparatus.

The simulation apparatus shown in FIG. 1 may be formed by an information processing apparatus (computer) shown in FIG. 11, for example. FIG. 11 is a system block diagram showing a structure of the information processing apparatus. The information processing apparatus shown in FIG. 11 includes a central processing unit (CPU) 91, a memory 92, an input device 93, an output device 94, an external storage unit 95, a medium driving unit 96, and a network connection unit 97 which are mutually connected via a bus 98.

For example, the memory 92 includes a ROM, a RAM and the like, and stores a computer program and data which are used for the simulation process. The CPU 91 executes the computer program stored in the memory 92, and carries out various processes including the simulation process. The memory 92 corresponds to the storage section 12 shown in FIG. 1. In addition, the computer program stored in the memory 92 corresponds to the control section 14, the skin resistance coefficient calculating section 15 and the analyzing section 16 shown in FIG. 1.

For example, the input device 93 is formed by a keyboard, a pointing device, a touch panel or the like, and is used to input instructions and information from the user. For example, the output device 94 is formed by a display, a printer, a speaker or the like, and is used to output inquiries to the user and results of the simulation process. The input device 93 corresponds to the input section 11 shown in FIG. 1, and the output device 94 corresponds to the display section 13 shown in FIG. 1.

For example, the external storage unit 95 is formed by a magnetic disk unit, an optical disk unit, a magneto-optic disk unit, a tape unit or the like. The information processing apparatus stores the computer program and the data described above in the external storage unit 95, and loads the computer program and the data into the memory 92 when necessary for use by the CPU 91.

The medium driving unit 96 drives a portable recording medium 99 and accesses recorded contents of the portable recording medium 99. An arbitrary computer-readable storage medium such as a memory card, a floppy disk, a CD-ROM, an optical disk and a magneto-optical disk, may be used as the portable recording medium 99. The computer program and the data described above may be recorded on this portable recording medium 99, and in this case, the computer program and the data are downloaded to the external storage unit 95 when necessary.

The network connection unit 97 is connected to an arbitrary communication network such as a LAN and the Internet, and carries out the necessary data conversion in accordance with the communication. The information processing apparatus may receive the computer program and the data described above from another apparatus via the network connection unit 97 and load the computer program and the data into the memory 92.

Figure 12:
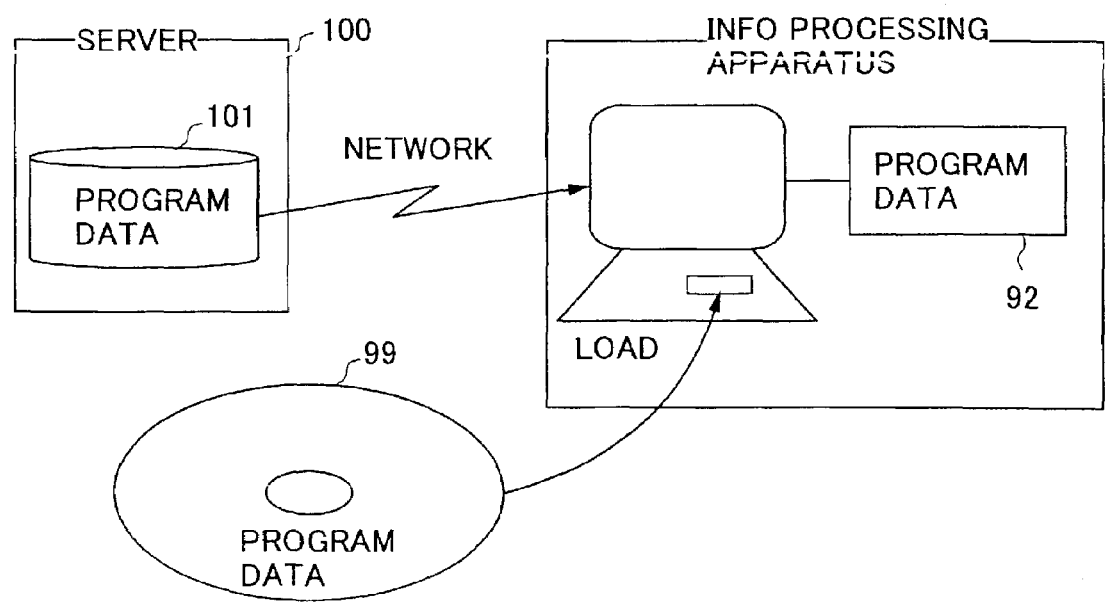
FIG. 12 is a diagram showing a computer-readable storage medium.

FIG. 12 is a diagram showing a computer-readable storage medium which may supply the computer program and the data described above to the information processing apparatus shown in FIG. 11. The computer program and the data stored in the portable recording medium 99 or a database 101 of a server 100 are loaded into the memory 92. The server 100 generates a carrier signal for carrying the computer program and the data, and transmits the carrier signal to the information processing apparatus via an arbitrary transmission medium in the network. The CPU 91 executes the computer program using the data, which are both stored in the memory 92, to carry out the necessary processes including the simulation process.

Next, a description will be given of a second embodiment of the simulation apparatus according to the present invention. An important part of this second embodiment of the simulation apparatus is the same as the corresponding important part of the first embodiment of the simulation apparatus shown in FIG. 1, and an illustration and description thereof will be omitted. This second embodiment of the simulation apparatus employs a second embodiment of the simulation method according to the present invention and a second embodiment of the computer-readable storage medium according to the present invention. The control section 14, the skin resistance coefficient calculating section 15 and the analyzing section 16 shown in FIG. 1 correspond to a computer program for carrying out the second embodiment of the simulation method.

When making the noise analysis with respect to a plurality of conductors, the width of the GND conductor becomes larger as the pitch between the signal conductors becomes larger. For this reason, there is a possibility that a relatively long calculation time will be required according to the first embodiment employing the calculation method which obtains the parameters such as the conductor resistances by dividing the conductor into the segments.

The present inventors have found that, as the distance between the signal conductors becomes larger, the mutual interaction of the signal conductors no longer occurs, and the value of the non-diagonal component approaches zero. The present inventors also found that, as the non-diagonal component approaches zero, the resistance of the signal conductor also approaches a constant value.

Figure 13:
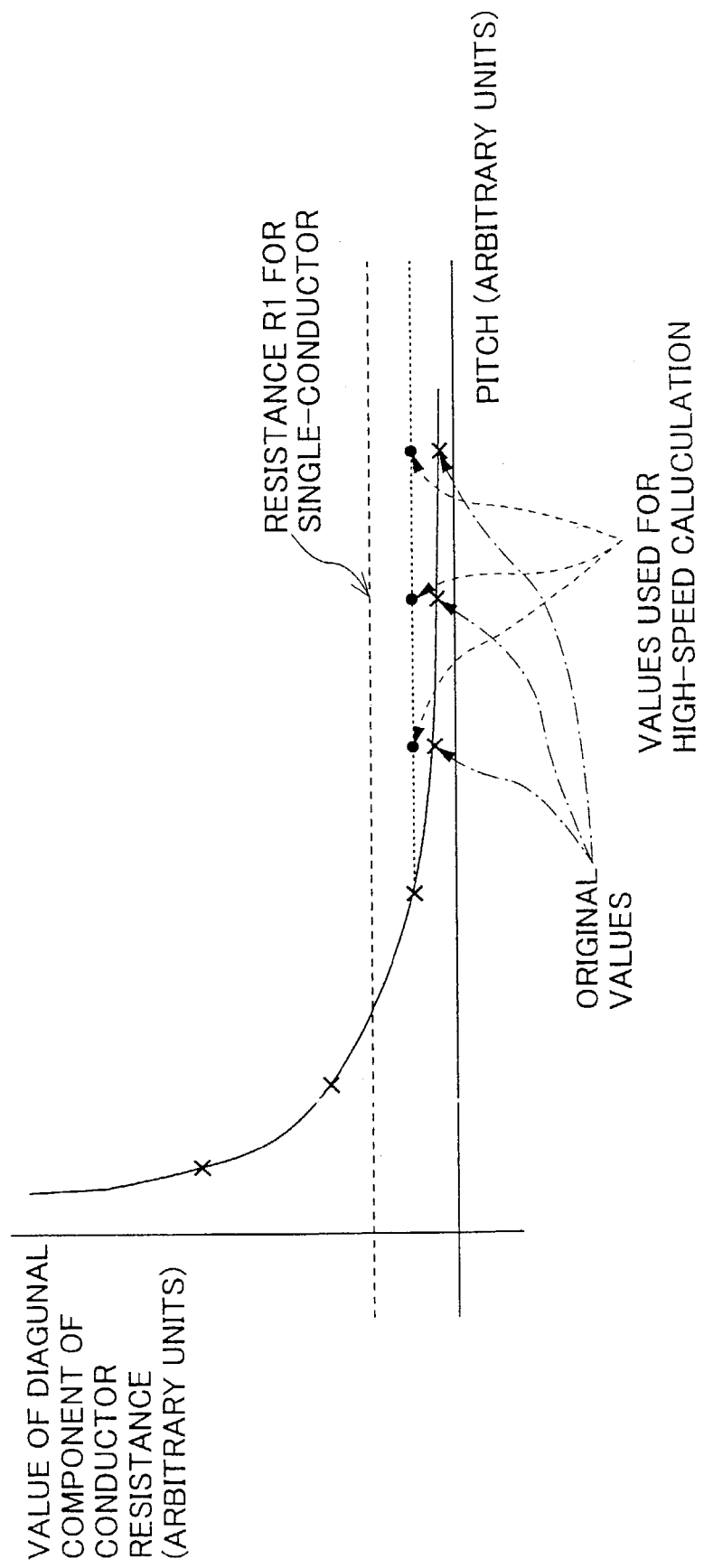
FIG. 13 is a diagram for explaining a calculation of a resistance in a second embodiment of the simulation apparatus.

FIG. 13 is a diagram for explaining a calculation of a resistance in this second embodiment of the simulation apparatus. In FIG. 13, the ordinate indicates the value of the diagonal component of the conductor resistance in arbitrary units, and the abscissa indicates the pitch between the conductors in arbitrary units. In addition, a dotted line in FIG. 13 indicates a resistance R1 of the single-conductor obtained for one of a plurality of conductors having a largest cross sectional area. Furthermore, in FIG. 13, a symbol "X" indicates original values of the diagonal component of the conductor resistance of two or more conductors, and a symbol "●" indicates values of the diagonal component of the conductor resistance of two or more conductors used in the second embodiment for the purpose of carrying out a high-speed calculation. As may be seen from FIG. 13, when the pitch between the conductors is greater than a predetermined value, a large difference does not occur between the values of the diagonal component of the conductor resistance, and an error from the original value of the diagonal component of the conductor resistance is small. For this reason, when the pitch between the conductors is greater than the predetermined value, it is possible to greatly reduce the calculation time by omitting the calculations, using the value of the diagonal component of the conductor resistance indicated by the symbol "●".

In other words, the second embodiment obtains the resistance R1 of the single-conductor for one of the plurality of conductors having the largest cross sectional area, and uses the value of the diagonal component of the conductor resistance for a predetermined pitch with respect to pitches greater than the predetermined pitch, as the pitch between the conductors becomes larger and the value of the diagonal component of the conductor resistance becomes R1 or less at the predetermined pitch.

Figure 14:
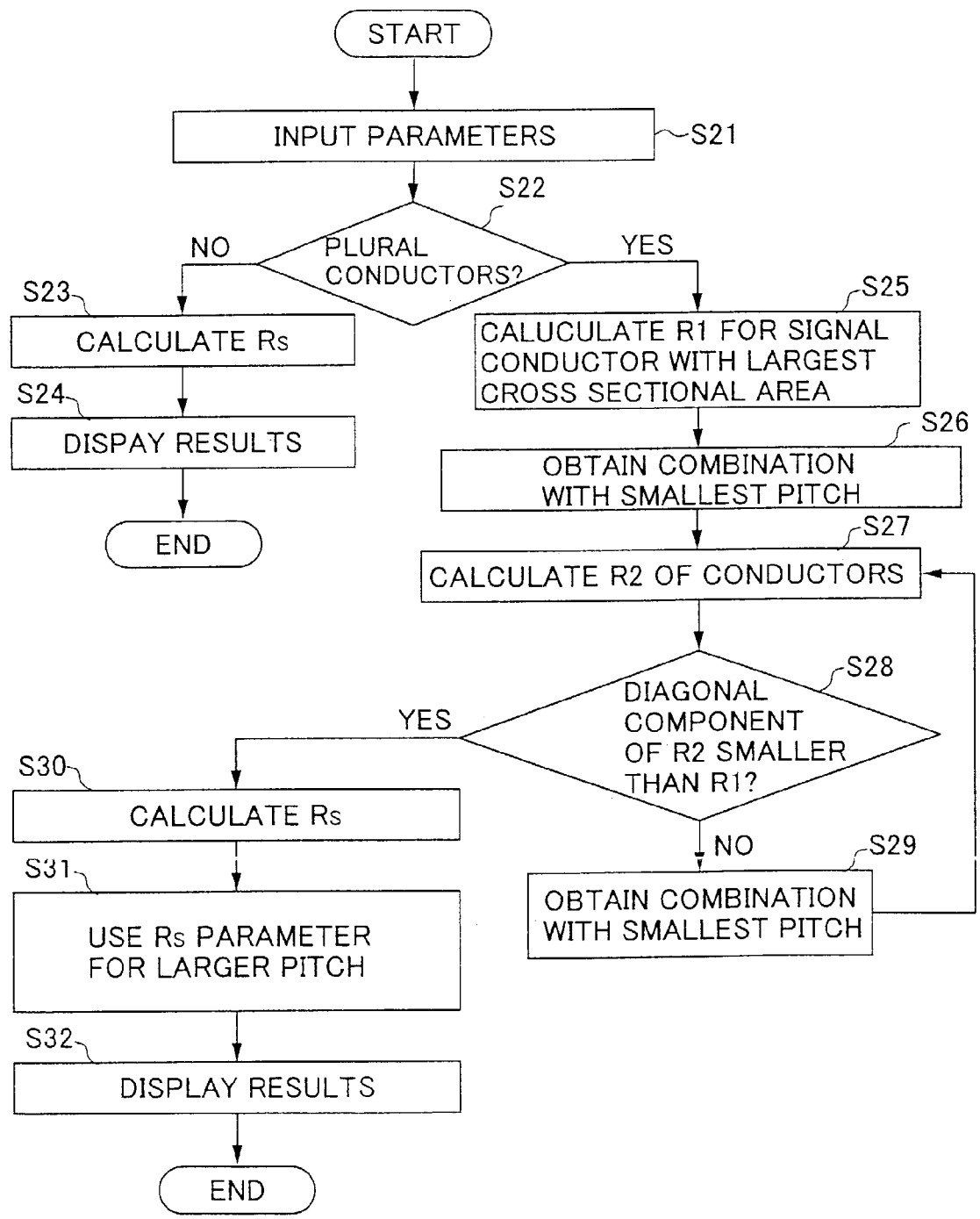
FIG. 14 is a flow chart for explaining a calculation process of a skin resistance coefficient calculating section of the second embodiment.

FIG. 14 is a flow chart for explaining a calculation process of the skin resistance coefficient calculating section 15 of the second embodiment. In FIG. 14, a step S21 corresponds to the step S1 shown in FIG. 2, and inputs the parameters related to the conductors, that is, the wiring. A step S22 decides whether or not a plurality of conductors exist. If the decision result in the step S22 is NO, a step S23 calculates the skin resistance coefficient Rs, and a step S24 displays the calculation results on the display section 13 and outputs the calculation results to the log file, similarly to the first embodiment described above, and the process ends. The steps S23 and S24 correspond to the steps S3 through S11 shown in FIG. 2.

On the other hand, if the decision result in the step S22 is YES, a step S25 calculates in advance the resistance R1 of one of the plurality of conductors having the largest cross sectional area. A step S26 obtains a combination of the conductors having a smallest pitch therebetween. A step S27 calculates a resistance R21 of the obtained combination of conductors. A step S28 decides whether or not the diagonal component of the resistance R2 is smaller than the resistance R1. If the decision result in the step S28 is NO, a step S29 obtains a combination of the conductors having the next smallest pitch therebetween, and the process returns to the step S27.

If the decision result in the step S28 is YES, a step S30 calculates the skin resistance coefficient Rs similarly to the first embodiment described above, with respect to a combination of conductors having a pitch therebetween smaller than the pitch which makes the decision result of the step S28 YES. A step S31 uses the skin resistance coefficient Rs calculated in the step S30 as a substitute when the decision result becomes YES in the step S28, with respect to a combination of conductors having a pitch therebetween larger than or equal to the pitch which makes the decision result of the step S28 YES. A step S32 displays the calculation results on the display section 13 and outputs the calculation results in the log file. The steps S25 through S32 correspond to the steps S3 through S11 shown in FIG. 2.

Of the parameters which are obtained by the calculations and used for the simulation, if a certain parameter other than the skin resistance coefficient Rs saturates and becomes approximately constant when the pitch between the conductors becomes greater than or equal to a predetermined pitch, the calculations may be omitted similarly for the certain parameter to further reduce the calculation time. In addition, if a certain parameter saturates and becomes approximately constant when the pitch between the conductors becomes less than a predetermined pitch, the calculations may be omitted similarly for this certain parameter to further reduce the calculation time.

Further, the present invention is not limited to these embodiments, but various variations and modifications may be made without departing from the scope of the present invention.

What is claimed is:

1. A simulation method for making a noise analysis based on parameters including a conductor resistance which takes skin effect into consideration, comprising:

calculating a first resistance of a conductor having a largest cross-sectional area of a plurality of conductors;

obtaining a predetermined pitch which saturates a diagonal component of a second resistance of a conductor with reference to the first resistance and makes the diagonal component substantially constant, by varying a pitch of the conductors;

calculating at least one of the parameters for each pitch with respect to one of the pitches larger than or equal to the predetermined pitch and the pitches smaller than the predetermined pitch, and substituting the at least one parameter calculated for said one of the pitches with respect to the other of the pitches larger than or equal to the predetermined pitch and the pitches smaller than the predetermined pitch;

omitting calculations for at least one parameter that saturates and becomes approximately constant when a pitch between the conductors becomes greater than or equal to the predetermined pitch; and outputting calculation results of the calculating at least one of the parameters which take the skin effect into consideration.

2. The simulation method as claimed in claim 1, wherein said calculating at least one of the parameters substitutes a skin resistance coefficient calculated for a largest pitch of the pitches smaller than the predetermined pitch, with respect to the pitches larger than or equal to the predetermined pitch.

3. The simulation method as claimed in claim 1, wherein said calculating at least one of the parameters comprises:

generating a model in which the conductor is divided into a plurality of segments by a plurality of planes parallel to a surface of the conductor, said plurality of planes having a pitch which is smaller towards the surface of the conductor and larger in a direction away from the surface of the conductor; and calculating the skin resistance coefficient of the conductor corresponding to a signal frequency, using the generated model.

4. The simulation method as claimed in claim 1, wherein said calculating at least one of the parameters comprises:

calculating a depth of a skin of the conductor using a signal frequency;

generating a model in which a signal conductor is divided vertically and horizontally into a plurality of segments by a plurality of planes parallel to a surface of the signal conductor at a plurality of division rates which are set so that a pitch of the plurality of planes is smaller towards the surface of the signal conductor and larger in a direction away from the surface of the signal conductor, and in which a ground conductor is divided vertically into a plurality of segments by a plurality of planes parallel to a surface of the ground conductor at the plurality of division rates, and further divided horizontally by a plurality of planes which are set based on a distance between the signal conductor and the ground conductor, where a depth from the surface of the conductor is described by a product of the depth of the skin and the division rate; and calculating a resistance of the signal conductor corresponding to the signal frequency, using the generated model.

5. A simulation apparatus for making a noise analysis based on parameters including a conductor resistance which takes skin effect into consideration, comprising:

a first part configured to calculate a first resistance of a conductor having a largest cross-sectional area of a plurality of conductors;

a second part configured to obtain a predetermined pitch which saturates a diagonal component of a second resistance of a conductor with reference to the first resistance and makes the diagonal component approximately constant, by varying a pitch of the conductors;

a third part configured to calculate at least one of the parameters for each pitch with respect to one of the pitches larger than or equal to the predetermined pitch and the pitches smaller than the predetermined pitch, and to substitute the at least one parameter calculated for said one of the pitches with respect to the other of the pitches larger than or equal to the predetermined pitch and the pitches smaller than the predetermined pitch;

omitting calculations for at least one parameter that saturates and becomes approximately constant when a pitch between the conductors becomes greater than or equal to the predetermined pitch; and a fourth part configured to output calculation results of the third part, which take the skin effect into consideration.

6. The simulation apparatus as claimed in claim 5, wherein said third part substitutes a skin resistance coefficient calculated for a largest pitch of the pitches smaller than the predetermined pitch, with respect to the pitches larger than or equal to the predetermined pitch.

7. The simulation apparatus as claimed in claim 5, wherein said third part comprises:

a part configured to generate a model in which the conductor is divided into a plurality of segments by a plurality of planes parallel to a surface of the conductor, said plurality of planes having a pitch which is smaller towards the surface of the conductor and larger in a direction away from the surface of the conductor; and a part configured to calculate the skin resistance coefficient of the conductor corresponding to a signal frequency, using the generated model.

8. The simulation apparatus as claimed in claim 5, wherein said third part comprises:

a part configured to calculate a depth of a skin of the conductor using a signal frequency;

a part configured to generate a model in which a signal conductor is divided vedically and horizontally into a plurality of segments by a plurality of planes parallel to a surface of the signal conductor at a plurality of division rates which are set so that a pitch of the plurality of planes is smaller towards the surface of the signal conductor and larger in a direction away from the surface of the signal conductor, and in which a ground conductor is divided vertically into a plurality of segments by a plurality of planes parallel to a surface of the ground conductor at the plurality of division rates, and further divided horizontally by a plurality of planes which are set based on a distance between the signal conductor and the ground conductor, where a depth from the surface of the conductor is described by a product of the depth of the skin and the division rate; and a part configured to calculate a resistance of the signal conductor corresponding to the signal frequency, using the generated model.

9. A computer-readable storage medium which stores a program for causing a computer to make a noise analysis based on parameters including a conductor resistance which takes skin effect into consideration, said program comprising:
- a first procedure causing the computer to calculate a first resistance of a conductor having a largest cross-sectional area of a plurality of conductors;
- a second procedure causing the computer to obtain a predetermined pitch which saturates a diagonal component of a second resistance of a conductor with reference to the first resistance and makes the diagonal component approximately constant, by varying a pitch of the conductors;
- a third procedure causing the computer to calculate at least one of the parameters for each pitch with respect to one of the pitches larger than or equal to the predetermined pitch and the pitches smaller than the predetermined pitch, and substitute the at least one parameter calculated for said one of the pitches with respect to the other of the pitches larger than or equal to the predetermined pitch and the pitches smaller than the predetermined pitch and causing the computer to omitt calculations for at least one parameter that saturates and becomes approximately constant when a pitch between the conductors becomes greater than or equal to the predetermined pitch;
- a fourth procedure causing the computer to output calculation results of the third procedure, which take the skin effect into consideration.

10. The computer-readable storage medium as claimed in claim 9, wherein said third procedure causes the computer to substitute a skin resistance coefficient calculated for a largest pitch of the pitches smaller than the predetermined pitch, with respect to the pitches larger than or equal to the predetermined pitch.

11. The computer-readable storage medium as claimed in claim 9, wherein said third procedure causes the computer to:
- generate a model in which the conductor is divided into a plurality of segments by a plurality of planes parallel to a surface of the conductor, said plurality of planes having a pitch which is smaller towards the surface of the conductor and larger in a direction away from the surface of the conductor; and
- calculate the skin resistance coefficient of the conductor corresponding to a signal frequency, using the generated model.

12. The computer-readable storage medium as claimed in claim 9, wherein said third procedure causes the computer to:
- calculate a depth of a skin of the conductor using a signal frequency;
- generate a model in which a signal conductor is divided vertically and horizontally into a plurality of segments by a plurality of planes parallel to a surface of the signal conductor at a plurality of division rates which are set so that a pitch of the plurality of planes is smaller towards the surface of the signal conductor and larger in a direction away from the surface of the signal conductor, and in which a ground conductor is divided vertically into a plurality of segments by a plurality of planes parallel to a surface of the ground conductor at the plurality of division rates, and further divided horizontally by a plurality of planes which are set based on a distance between the signal conductor and the ground conductor, where a depth from the surface of the conductor is described by a product of the depth of the skin and the division rate; and
- calculate a resistance of the signal conductor corresponding to the signal frequency, using the generated model.

13. A simulation apparatus for making a noise analysis based on parameters including a conductor resistance which takes skin effect into consideration, comprising:
- first means for calculating a first resistance of a conductor having a largest cross-sectional area of a plurality of conductors;
- second means for obtaining a predetermined pitch which saturates a diagonal component of a second resistance of a conductor with reference to the first resistance and makes the diagonal component approximately constant, by varying a pitch of the conductors;
- third means for calculating at least one of the parameters for each pitch with respect to one of the pitches larger than or equal to the predetermined pitch and the pitches smaller than the predetermined pitch, and substituting the at least one parameter calculated for said one of the pitches with respect to the other of the pitches larger than or equal to the predetermined pitch and the pitches smaller than the predetermined pitch and for omitting calculations for at least one parameter that saturates and becomes approximately constant when a pitch between the conductors becomes greater than or equal to the predetermined pitch; and
- fourth means for outputting calculation results of the third means, which take the skin effect into consideration.

14. A simulation method for making a noise analysis based on parameters including a conductor resistance which takes skin effect into consideration, comprising:
- calculating at least one of the parameters for each pitch with respect to one of the pitches larger than or equal to a predetermined pitch and the pitches smaller than the predetermined pitch;
- substituting the at least one parameter calculated for said one of the pitches with respect to another of the pitches larger than or equal to the predetermined pitch and the pitches smaller than the predetermined pitch; and
- omitting calculations for at least one parameter that saturates and becomes approximately constant when a pitch between the conductors becomes greater than or equal to the predetermined pitch; and
- outputting calculation results which take the skin effect into consideration.

* * * * *

UNITED STATES PATENT AND TRADEMARK OFFICE
CERTIFICATE OF CORRECTION

| | |
|---|---|
| PATENT NO. | : 7,313,509 B2 |
| APPLICATION NO. | : 10/345338 |
| DATED | : December 25, 2007 |
| INVENTOR(S) | : Megumi Nagata et al. |

It is certified that error appears in the above-identified patent and that said Letters Patent is hereby corrected as shown below:

Column 14, Line 48, change "vedically" to --vertically--.

Column 15, Line 24, change "omitt" to --omitting--.

Signed and Sealed this

Twenty-seventh Day of May, 2008

JON W. DUDAS
*Director of the United States Patent and Trademark Office*